United States Patent
Hoshi et al.

(10) Patent No.: US 10,276,666 B2
(45) Date of Patent: Apr. 30, 2019

(54) SEMICONDUCTOR DEVICE

(71) Applicant: FUJI ELECTRIC CO., LTD., Kawasaki-shi, Kanagawa (JP)

(72) Inventors: Yasuyuki Hoshi, Matsumoto (JP); Masahito Otsuki, Matsumoto (JP); Shoji Yamada, Matsumoto (JP); Takashi Shiigi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/691,223

(22) Filed: Aug. 30, 2017

(65) Prior Publication Data
US 2017/0365665 A1  Dec. 21, 2017

Related U.S. Application Data

(63) Continuation of application No. PCT/JP2016/073369, filed on Aug. 8, 2016.

(30) Foreign Application Priority Data

Sep. 16, 2015  (JP) .................................. 2015-183480

(51) Int. Cl.
*H01L 29/16* (2006.01)
*H01L 29/12* (2006.01)
(Continued)

(52) U.S. Cl.
CPC ...... *H01L 29/1608* (2013.01); *H01L 29/0696* (2013.01); *H01L 29/12* (2013.01);
(Continued)

(58) Field of Classification Search
CPC ............... H01L 29/1608; H01L 29/785; H01L 29/7813; H01L 29/66734; H01L 29/66795; H01L 29/456
See application file for complete search history.

(56) References Cited

U.S. PATENT DOCUMENTS 5,233,215 A * 8/1993 Baliga ................. H01L 29/0619
257/339
5,506,421 A * 4/1996 Palmour ............. H01L 29/7813
257/77
(Continued)

FOREIGN PATENT DOCUMENTS

JP  2010-505270 A  2/2010
JP  2010-147298 A  7/2010
(Continued)

OTHER PUBLICATIONS

K. Shenai et al., "Optimum Semiconductors for High-Power Electronics", IEEE Transactions on Electron Devices, vol. 36, No. 9, pp. 1811-1823, Sep. 1989.
(Continued)

*Primary Examiner* — William Coleman
(74) *Attorney, Agent, or Firm* — Rabin & Berdo, P.C.

(57) ABSTRACT

On a front surface of an $n^+$-type SiC substrate becoming a drain region, an $n^-$-type drift layer, a p-type base layer, and an $n^+$-type source layer are sequentially formed by epitaxial growth. In the $n^+$-type source layer, the $p^+$-type contact region is selectively provided. A trench is provided penetrating the $n^+$-type source layer and the p-type base layer in the depth direction and reaching the $n^-$-type drift layer. In the trench, a gate electrode is provided via a gate insulating film. A width between adjacent trenches is, for example, 1 μm or less. A depth of the trench is, for example, 1 μm or less. The width is narrow whereby substantially the entire p-type base layer forms a channel. A cell includes a FinFET structure in which one channel is sandwiched between MOS gates on both side. Thus, ON resistance may be reduced and decreased reliability may be prevented.

8 Claims, 9 Drawing Sheets

(51) Int. Cl.
  *H01L 29/45* (2006.01)
  *H01L 29/66* (2006.01)
  *H01L 29/78* (2006.01)
  *H01L 29/06* (2006.01)
  *H01L 29/417* (2006.01)
  *H01L 29/10* (2006.01)
  *H01L 29/20* (2006.01)

(52) U.S. Cl.
  CPC ...... *H01L 29/456* (2013.01); *H01L 29/66734* (2013.01); *H01L 29/66795* (2013.01); *H01L 29/785* (2013.01); *H01L 29/7813* (2013.01); *H01L 29/1095* (2013.01); *H01L 29/2003* (2013.01); *H01L 29/41766* (2013.01)

(56) References Cited

U.S. PATENT DOCUMENTS

| | | | |
|---|---|---|---|
| 7,033,892 B2 * | 4/2006 | Hsu | H01L 29/66068 257/E21.066 |
| 7,423,316 B2 * | 9/2008 | Kawaji | H01L 29/0696 257/330 |
| 9,105,679 B2 * | 8/2015 | Laven | H01L 29/7397 |
| 9,543,428 B2 * | 1/2017 | Takeuchi | H01L 21/8213 |
| 9,997,602 B2 * | 6/2018 | Laven | H01L 29/42368 |
| 2008/0073707 A1 | 3/2008 | Darwish | |
| 2011/0309464 A1 | 12/2011 | Yamamoto et al. | |
| 2012/0326207 A1 | 12/2012 | Yoshimochi | |
| 2016/0020289 A1 | 1/2016 | Nakano et al. | |

FOREIGN PATENT DOCUMENTS

| | | |
|---|---|---|
| JP | 2011-159797 A | 8/2011 |
| JP | 2012-009502 A | 1/2012 |
| JP | 2013-033931 A | 2/2013 |
| JP | 2014-132600 A | 7/2014 |
| JP | 2014-175314 A | 9/2014 |

OTHER PUBLICATIONS

B. Jayant Baliga, "Silicon Carbide Power Devices", U.S.A, World Scientific Publishing Co., pp. 60-69, Mar. 30, 2006.

* cited by examiner

SEMICONDUCTOR DEVICE

CROSS REFERENCE TO RELATED APPLICATIONS

This is a continuation application of International Application PCT/JP2016/073369 filed on Aug. 8, 2016 which claims priority from a Japanese Patent Application No. 2015-183480 filed on Sep. 16, 2015, the contents of which are incorporated herein by reference.

BACKGROUND OF THE INVENTION

1. Field of the Invention

Embodiments of the present invention related to a semiconductor device.

2. Description of the Related Art

Silicon (Si) has been used as a constituent material of power semiconductor devices that control high voltage and/or large current. There are several types of power semiconductor devices such as bipolar transistors, insulated gate bipolar transistors (IGBTs), metal oxide semiconductor field effect transistors (MOSFETs), etc. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

However, there has been a strong demand in the market for a power semiconductor device that achieves both large current and high speed. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pages 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to all semiconductors having a wide bandgap greater than silicon (hereinafter, wide bandgap semiconductors), such as gallium nitride (GaN). Thus, a high-voltage semiconductor device can be achieved by using a wide bandgap semiconductor (see, for example, B. Jayant Baliga, "Silicon Carbide Power Devices", U.S.A, World Scientific Publishing Co., Mar. 30, 2006, page 61).

A structure of a conventional semiconductor device will be described taking, as an example, an n-channel type MOSFET that has a planar gate structure and that is a switching device produced using silicon carbide. FIG. 9 is a perspective view of a structure of an active region of a conventional semiconductor device. As depicted in FIG. 9, in the conventional semiconductor device, on a front surface of an $n^+$-type supporting substrate (hereinafter, $n^-$-type SiC substrate) 101 including silicon carbide, an $n^-$-type semiconductor layer (hereinafter, $n^-$-type SiC layer) 102 including silicon carbide is provided. The $n^+$-type SiC substrate 101 functions as a drain region. In a surface layer of the $n^-$-type SiC layer 102, on a side of the $n^-$-type SiC layer 102 opposite a side facing the $n^+$-type SiC substrate 101, a p-type base region 103 is selectively provided. A portion of the $n^-$-type SiC layer 102 other than the p-type base region 103 is a drift region.

On a surface of the $n^-$-type SiC layer 102, on the side of the $n^-$-type SiC layer 102 opposite the side facing the $n^+$-type SiC substrate 101, a p-type semiconductor layer (hereinafter, p-type SiC layer) 104 including silicon carbide is stacked. In the p-type SiC layer 104, at a portion facing the p-type base region 103 in a depth direction, an $n^+$-type source region 105 and a $p^+$-type contact region 106 are each selectively provided. An n-type semiconductor region 107 is provided penetrating the p-type SiC layer 104 in the depth direction, reaching the $n^-$-type SiC layer 102. The n-type semiconductor region 107 is arranged separate from the $n^+$-type source region 105, on a side of the $n^+$-type source region 105 opposite from a side facing the $p^+$-type contact region 106.

A portion (hereinafter, second p-type base region) 104a of the p-type SiC layer 104 other than the $n^+$-type source region 105, the $p^+$-type contact region 106, and the n-type semiconductor region 107 functions as a base region together with a p-type base region (hereinafter, first p-type base region) 103. The n-type semiconductor region (hereinafter, n-type junction FET (JFET) region) 107 is a JFET region between adjacent base regions and functions as a drift region together with the $n^-$-type SiC layer 102. An impurity concentration of the n-type JFET region 107 is higher than an impurity concentration of the $n^-$-type SiC layer 102 whereby an n-type impurity concentration of a portion of the drift region between adjacent base regions is increased, facilitating reduction of JFET resistance.

On a surface of a portion of the second p-type base region 104a between the $n^+$-type source region 105 and the n-type JFET region 107, a gate electrode 109 is provided from the $n^+$-type source region 105 to the n-type JFET region 107 via a gate insulating film 108. The source electrode 110 is in contact with the $n^+$-type source region 105 and the $p^+$-type contact region 106, and is electrically insulated from the gate electrode 109 by an interlayer insulating film 111. In FIG. 9, to clearly depict the arrangement of the $n^+$-type source region 105, the $p^+$-type contact region 106, and the gate electrode 109, a portion of the source electrode 110 in the front in the drawing is not depicted. On the source electrode 110, a source electrode pad 112 is provided. On a rear surface of the $n^+$-type SiC substrate 101, a drain electrode 113 is provided.

In the MOSFET of the configuration depicted in FIG. 9, when positive voltage with respect to the source electrode 110 is applied to the drain electrode 113 and voltage lower than a threshold voltage is applied to the gate electrode 109, a pn junction between the second p-type base region 104a and the n-type JFET region 107 becomes reversed biased, reverse breakdown voltage of the active region is established, and current does not flow. In contrast, when current equal to or greater than the threshold voltage is applied to the gate electrode 109, an n-type inversion layer (channel) is formed at a surface layer of a portion of the second p-type base region 104a directly beneath the gate electrode 109 (drain side). As a result of this, current flows through a path of the n⁺-type SiC substrate 101, the n⁻-type SiC layer 102, the n-type JFET region 107, the surface inversion layer of the second p-type base region 104, and the n⁺-type source region 105. In this manner, by controlling gate voltage, the widely known MOSFET switching operation may be performed.

Nonetheless, to take advantage of the characteristics of silicon carbide, even when silicon carbide is used and a MOS gate (insulated gate of a metal oxide film semiconductor) structure is formed as described above (refer to FIG. 9), channel mobility and the resistance of the n-type JFET region 107 (JFET resistance) cannot be increased and the ON resistance cannot be decreased. Therefore, to reduce the ON resistance, the channel resistance has to be reduced. As a semiconductor device for which the ON resistance has been reduced, a device has been proposed in which a width of the JFET region is set to be 0.8 μm to 3 μm and an impurity density of the JFET region is equal to or greater than an impurity density of the drift layer and set to be $1 \times 10^{16}$/cm³ or greater (for example, refer to Japanese Laid-Open Patent Publication No. 2011-159797). In Japanese Laid-Open Patent Publication No. 2011-159797, the ON resistance is reduced by a structure that lowers channel resistance and JFET resistance.

SUMMARY OF THE INVENTION

According to one aspect of the invention, a semiconductor device includes a semiconductor substrate of a first conductivity type and including a wide bandgap semiconductor having a bandgap wider than that of silicon; a first semiconductor layer of the first conductivity type provided on a front surface of the semiconductor substrate, the first semiconductor layer including the wide bandgap semiconductor and having an impurity concentration lower than that of the semiconductor substrate, the first semiconductor layer having a first side and a second side; a second semiconductor layer of a second conductivity type provided on the first side of the first semiconductor layer opposite the second side facing the semiconductor substrate, the semiconductor layer including the wide bandgap semiconductor and having a first side and a second side; a third semiconductor layer of the first conductivity type provided on the first side of the second semiconductor layer opposite the second side facing the semiconductor substrate, the third semiconductor layer including the wide bandgap semiconductor; a second-conductivity-type semiconductor region provided selectively in the third semiconductor layer, penetrating the third semiconductor layer in a depth direction and reaching the second semiconductor layer, the second-conductivity-type semiconductor region having an impurity concentration higher than that of the second semiconductor layer; a trench provided penetrating the third semiconductor layer and the second semiconductor layer, reaching the first semiconductor layer; a gate electrode provided in the trench via a gate insulating film; a first electrode provided in contact with the third semiconductor layer and the second-conductivity-type semiconductor region; and a second electrode provided in contact with a rear surface of the semiconductor substrate. A width between the trench and an adjacent trench and a depth of the trench are less than a minimum dimension achieving a predetermined current capacity material limit of silicon. The semiconductor device has a breakdown voltage of 1200V or higher.

In one embodiment of the semiconductor device, the width between the trench and the adjacent trench is 1 μm or less, and the depth of the trench is 1 μm or less.

In one embodiment of the semiconductor device, the trench is arranged in planar layout having a striped shape parallel to the front surface of the semiconductor substrate.

In one embodiment of the semiconductor device, the trench is arranged in a planar layout having a lattice shape parallel to the front surface of the semiconductor substrate.

In one embodiment, the semiconductor device includes a groove provided at a predetermined depth from surfaces on respective first sides of the third semiconductor layer and the second-conductivity-type semiconductor region, the respective first sides being opposite respective second sides of the third semiconductor layer and the second-conductivity-type semiconductor region facing the semiconductor substrate. The first electrode is provided to be in contact with the third semiconductor layer and the second-conductivity-type semiconductor region at an inner wall of the groove.

In one embodiment of the semiconductor device, silicon carbide is used as the wide bandgap semiconductor.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
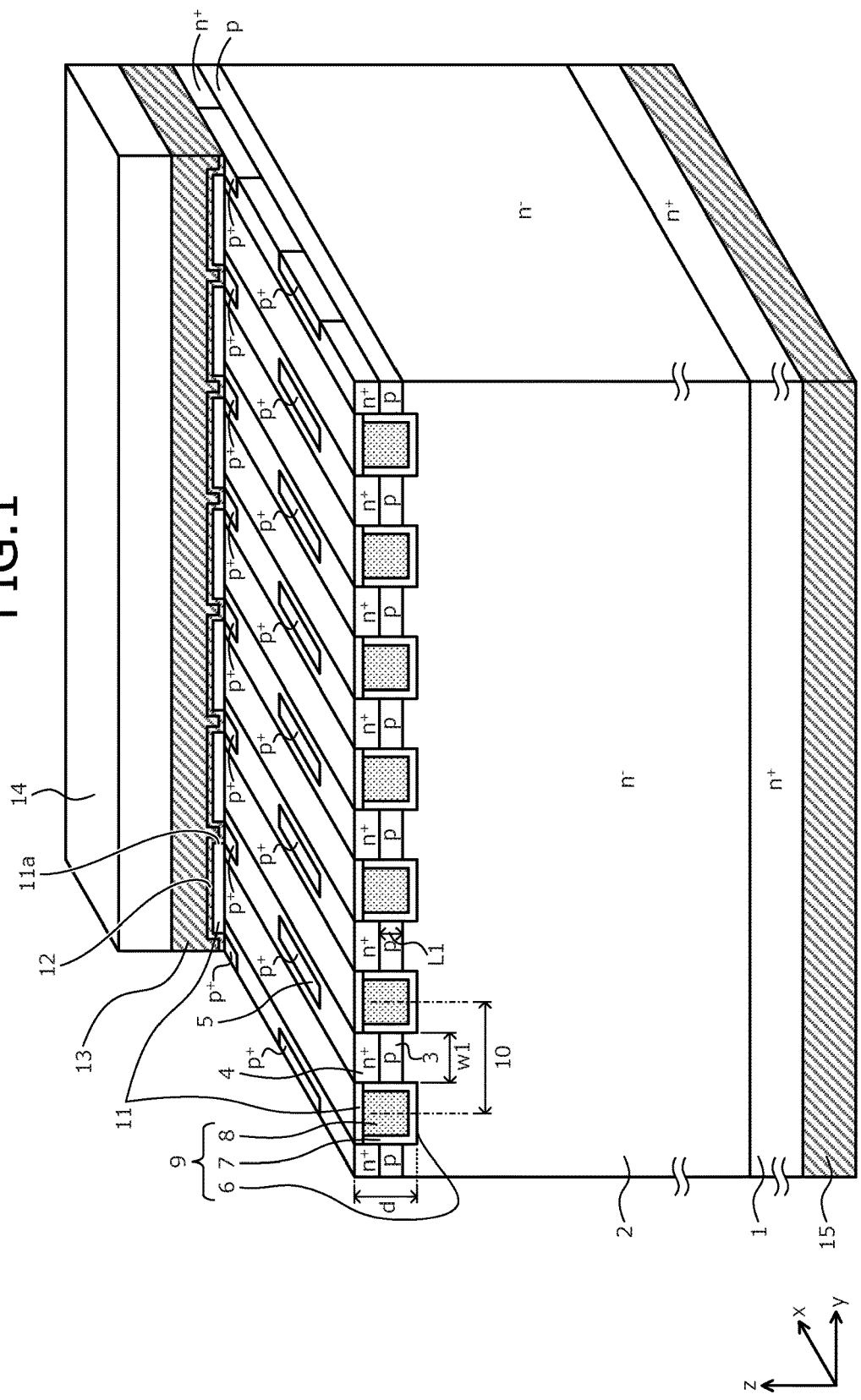
FIG. 1 is a perspective view of a structure of a semiconductor device according to a first embodiment.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

The semiconductor device according to a first embodiment is a metal oxide semiconductor (MOS) semiconductor device configured using a wide bandgap semiconductor material. A structure of the semiconductor device according to the first embodiment will be described, taking as an example, a MOSFET using, for example, silicon carbide (SiC) as a semiconductor having a wider bandgap than silicon (Si) (wide bandgap semiconductor). While embodiments described below refer to SiC as a semiconductor having a wider bandgap than silicon, embodiments of the invention are not limited to SiC, but encompass any wide bandgap material having a bandgap wider than silicon, such as diamond, aluminum nitride, gallium nitride, and boron nitride. FIG. 1 is a perspective view of a structure of the semiconductor device according to the first embodiment. In FIG. 1, the active region alone is depicted and edge termination structure region surrounding a periphery of the active region is omitted from the drawing. The active region is a region in which current flows in an ON state. The edge termination structure region is a region that mitigates electric field on a base front surface side of the drift region and sustains the breakdown voltage.

The semiconductor device according to the first embodiment depicted in FIG. 1, is an n-channel type MOSFET using a silicon carbide semiconductor base (semiconductor chip). The silicon carbide semiconductor base, for example, is formed by sequentially forming by epitaxial growth on a front surface of an $n^+$-type supporting substrate (hereinafter, $n^+$-type SiC substrate) 1 including silicon carbide, an $n^-$-type drift layer 2, a p-type base layer 3, and an $n^+$-type source layer 4, each including silicon carbide. The $n^-$-type drift layer 2, the p-type base layer 3, and the $n^+$-type source layer 4 may be formed by ion implantation in place of epitaxial growth. The $n^+$-type SiC substrate 1 functions as a drain region. In a surface layer on a base front surface (surface on the $n^+$-type source layer 4 side) of the silicon carbide semiconductor base, a trench-gate-type MOS gate structure in which an insulated gate formed by a metal oxide semiconductor (MOS) gate 9 is selectively embedded in a U-shape penetrating the p-type base layer 3 and the $n^+$-type source layer 4 in a depth direction z is provided.

The p-type base layer 3 and the $n^+$-type source layer 4, for example, are deposited on the $n^-$-type drift layer 2 only in the active region. A total thickness of the p-type base layer 3 and the $n^+$-type source layer 4 is a dimension thinner than a depth of a trench 6 so that the $n^-$-type drift layer 2 and a gate electrode 8 described hereinafter face each other across a gate insulating film 7 of a sidewall of the trench 6. This is because when the total thickness of the p-type base layer 3 and the $n^+$-type source layer 4 is thin, surrounding of the channel occurs easily and when surrounding of the channel may occur, a thick dimension may be set. In the $n^+$-type source layer 4, a $p^+$-type contact region 5 is selectively provided. The $p^+$-type contact region 5 penetrates the $n^+$-type source layer 4 from the base front surface (surface of the $n^+$-type source layer 4) in the depth direction z and reaches the p-type base layer 3. The $p^+$-type contact region 5 may be arranged separately from the MOS gate 9 described hereinafter or may be in contact with the MOS gate 9. In FIG. 1, a case is depicted in which the $p^+$-type contact region 5 is arranged separately from the MOS gate 9.

Further, the $p^+$-type contact region 5 is arranged in a planar layout having a matrix shape in which $p^+$-type contact regions 5 are arranged at a predetermined interval along a first direction x along which the MOS gate 9 extends in a striped shape and the $p^+$-type contact regions 5 are adjacent to each other across the MOS gate 9 in a second direction y parallel to the base front surface and orthogonal to the first direction x. The trench 6 is provided penetrating the $n^+$-type source layer 4 and the p-type base layer 3 to reach the $n^-$-type drift layer 2 in the depth direction z. When the $p^+$-type contact region 5 is in contact with the MOS gate 9, the trench 6 penetrates the $n^+$-type source layer 4, the p-type base layer 3, and the $p^+$-type contact region 5 in the depth direction z. The trench 6 is arranged in plural in a planar layout extending in a striped shape along the first direction x. A width w1 between adjacent trenches 6 (mesa portion) and a depth d of the trenches 6 are less than a minimum dimension achieving a predetermined current capacity material limit of silicon (for example, about less than 10 μm). In particular, the width w1 between adjacent trenches 6 is, for example, 1 μm or less, and the depth d of the trenches 6 is, for example, 1 μm or less.

In the trench 6, the gate insulating film 7 is provided along an inner wall of the trench 6 and on the gate insulating film 7, the gate electrode 8 is provided. An upper end (source-side end portion) of the gate electrode 8 need not reach a height position of the base front surface. In other words, in the trench 6, on the gate electrode 8, an interlayer insulating film 11 described hereinafter may be embedded. The trench 6, the gate insulating film 7, and the gate electrode 8 constitute the MOS gate 9. The p-type base layer 3, the $n^+$-type source layer 4, and the $p^+$-type contact region 5 provided between centers of adjacent trenches 6 and MOS gates 9 facing each other across these regions constitute one cell (functional unit of an element) 10 of the MOS gate structure. The width w1 between adjacent trenches 6 is narrow whereby a channel (n-type inversion layer) is formed substantially in the entire p-type base layer 3. Therefore, the cell 10 of the MOS gate structure is a so-called double gate structure in which one channel is sandwiched by MOS gates 9 from both sides (both sides in the second direction y). In other words, the cell 10 has a FinFET structure. FIG. 1 depicts a state in which plural cells 10 are arranged in parallel.

The interlayer insulating film 11 is provided so as to cover the gate electrode 8. In a contact hole 11a penetrating the interlayer insulating film 11 in the depth direction, the $n^+$-type source layer 4 and the $p^+$-type contact region 5 are exposed. The contact hole 11a, for example, is provided in a planar layout extending in a striped shape along the first direction x. A barrier metal 12 is provided on a surface of the interlayer insulating film 11 and along an inner wall of the contact hole 11a to be in contact with the $n^+$-type source layer 4 and the $p^+$-type contact region 5. The barrier metal 12 has a function of preventing diffusion of metal atoms from a front electrode 13 described hereinafter toward the silicon carbide semiconductor base and the interlayer insulating film 11 and a function of preventing regions that face each other across the barrier metal 12 from reacting with each other.

The barrier metal 12, for example, may be a 3-layered structure of a titanium (Ti) film, a titanium nitride (TiN) film, and a titanium film sequentially stacked. The barrier metal 12 functions as a source electrode. The front electrode 13 is provided on the barrier metal 12 so as to be embedded in the contact hole 11a. The front electrode 13 is electrically connected to the $n^+$-type source layer 4 and the $p^+$-type contact region 5 via the barrier metal 12 and functions as a source electrode together with the barrier metal 12. The front electrode 13, for example, may be formed using aluminum (Al) or aluminum including a rate of 1% silicon (Ai-Si).

The front electrode 13 and the barrier metal 12 are electrically insulated from the gate electrode 8 by the interlayer insulating film 11. In FIG. 1, to clearly depict planar layouts of the n$^+$-type source layer 4, the p$^+$-type contact region 5, and the MOS gate 9, a portion of the barrier metal 12 and a portion of the front electrode 13 in the front of the drawing are not depicted (similarly in FIG. 2). On the front electrode 13, a front electrode pad 14 is provided. Further, on the base front surface, a gate electrode pad (not depicted) is provided separately from the front electrode pad 14. On a base rear surface (rear surface of the n$^+$-type SiC substrate 1), a rear electrode 15 functioning as a drain electrode is provided.

A method of manufacturing the semiconductor device according to the first embodiment will be described, taking as an example, a case in which, for example, an n-channel type MOSFET with a breakdown voltage class of 1200V is produced. First, for example, the n$^+$-type SiC substrate 1 doped with nitrogen (N) and having an impurity concentration of about $2 \times 10^{19}/\text{cm}^3$ is prepared. The n$^+$-type SiC substrate 1 may have a main surface that is, for example, a (000-1) face having an OFF angle of about 4 degrees in a <11-20> direction. Next, on the main surface of the n$^+$-type SiC substrate 1, for example, silicon carbide doped with nitrogen and having an impurity concentration of $1.0 \times 10^{16}/\text{cm}^3$ is formed by epitaxial growth to have a thickness of 10 µm, becoming the n$^-$-type drift layer 2. Next, on the n$^-$-type drift layer 2 in the active region, for example, silicon carbide doped with aluminum and becoming the p-type base layer 3 is formed by epitaxial growth.

Next, on the p-type base layer 3 in the active region, for example, silicon carbide doped with nitrogen and becoming the n$^+$-type source layer 4 is formed by epitaxial growth. By the processes up to here, the silicon carbide semiconductor base in which the n$^-$-type drift layer 2, the p-type base layer 3, and the n$^+$-type source layer 4 are sequentially stacked on the front surface of the n$^+$-type SiC substrate 1 is produced. In place of epitaxial growth, the n$^-$-type drift layer 2, the p-type base layer 3, and the n$^+$-type source layer 4 may be formed by ion implantation. Next, by photolithography and ion implantation, the p$^+$-type contact region 5 is selectively formed in the n$^+$-type source layer 4. Next, by heat treatment (annealing), the p$^+$-type contact region 5 is activated. The heat treatment for activation, for example, may be performed at a temperature of about 1620 degrees C. for about 2 minutes.

Next, by photolithography and etching, the trench 6 is formed penetrating the n$^+$-type source layer 4 and the p-type base layer 3 in the depth direction z to reach the n$^-$-type drift layer 2. The width w1 between adjacent trenches 6 and the depth d of the trenches 6 is as described above. The sequence in which the p$^+$-type contact region 5 and the trench 6 are formed may be interchanged. Next, the base front surface (surface on the n$^+$-type source layer 4 side) and the inner wall of the trench 6 are thermally oxidized, forming along the inner wall of the trench 6 and the base front surface, the gate insulating film 7 having a thickness of, for example, about 50 nm to 100 nm. The thermal oxidation for forming the gate insulating film 7, for example, may be heat treatment performed in a mixed gas atmosphere including oxygen ($O_2$) and nitrogen ($N_2$) at a temperature of about 1000 to 1300 degrees C.

Next, on the base front surface, a poly-silicon (poly-Si) layer doped with, for example, phosphorus (P) or boron (B) is deposited (formed) so as to be embedded in the trench 6. Next, the poly-silicon layer is etched until the gate insulating film 7 on a substrate front surface is exposed and the poly-silicon layer is left inside the trench 6 to become the gate electrode 8. Next, the gate electrode 8 is used as a mask, and the gate insulating film 7 on the substrate front surface is removed. Next, for example, Phospho Silicate Glass (PSG) is formed to have a thickness of 1.0 µm and so as to cover the gate electrode 8 and become the interlayer insulating film 11. Next, the interlayer insulating film 11 is patterned and selectively removed, forming the contact hole 11a penetrating the interlayer insulating film 11 in the depth direction z, and exposing the n$^+$-type source layer 4 and the p$^+$-type contact region 5. Next, heat treatment (reflow) for planarizing the interlayer insulating film 11 is performed.

Next, for example, by sputtering, the barrier metal 12 is formed along the surface of the interlayer insulating film 11 and the inner wall of the contact hole 11a so as to be in contact with the n$^+$-type source layer 4 and the p$^+$-type contact region 5. Next, for example, after the front electrode 13 is formed on the barrier metal 12 by sputtering so as to be embedded in the contact hole 11a, the front electrode 13 and the barrier metal 12 are patterned. A thickness of the front electrode 13 may be, for example, 5 µm. Next, for example, by sputtering, a nickel (Ni) film is formed as the rear electrode 15 on the entire base rear surface (rear surface of the n$^+$-type SiC substrate 1). For example, heat treatment at a temperature of about 970 degrees C. is performed, causing the n$^+$-type SiC substrate 1 and the nickel film to react, forming a nickel silicide film, and thereby forming an ohmic contact (electrical contact potion) of the n$^+$-type SiC substrate 1 and the rear electrode 15.

Next, for example, a metal layer is deposited on the front electrode 13 by sputtering and is patterned whereby the front electrode pad 14 and the gate electrode pad are formed. Next, for example, a protection film (not depicted) such as a passivation film including a polyimide is formed so as to cover the base front surface exposed in the edge termination structure region (not depicted). Next, for example, titanium, nickel, and gold (Au) films are sequentially formed by sputtering on a surface of a nickel film (a surface of a nickel silicide film by heat treatment conditions for forming an ohmic contact) as the rear electrode 15 whereby the n-channel type MOSFET depicted in FIG. 1 is completed.

As described above, according to the first embodiment, JFET resistance may be eliminated by configuring a trench gate structure, and the channel resistance may be reduced by reducing the trench depth and shortening the channel length. Further, in an ordinary semiconductor device using silicon, the trench depth based on the material limits of silicon is, for example, about 10 µm. However, in the present invention, a wide bandgap semiconductor material having a critical electric field strength that is 10 times or more than that of silicon is used. Therefore, according to the first embodiment, even when the characteristics of a wide bandgap semiconductor are taken advantage of, the trench depth is reduced to about 1/10 that of an ordinary semiconductor device that uses silicon and the channel length is shortened, a current capacity that is about the same as or greater than that of an ordinary semiconductor device that uses silicon may be obtained. Therefore, the ON resistance may be reduced while maintaining a current capacity that is about the same as or greater than that of an ordinary semiconductor device that uses silicon.

Further, according to the first embodiment, by employing a FinFET structure in which the width between adjacent trenches is reduced, at low gate-voltage operating area (operating region of a linear region near a boundary with the shutout region), the p-type base layer may be completely depleted. As a result, short channel effects may be suppressed whereby the flow of drain current becomes difficult in the low gate-voltage operating area. Further, after pinch off, in the region (saturation region) operating at a high voltage between the drain and source as well, the flow of drain current becomes difficult. Thus, drain current may be controlled by the gate voltage alone and decreases in the switching operation reliability may be prevented.

According to the first embodiment, by employing a Fin-FET structure, cell pitch may be reduced, enabling size reductions. Further, according to the first embodiment, by employing a FinFET structure, the channel impurity concentration may be lowered and channel resistance may be reduced.

Figure 2:
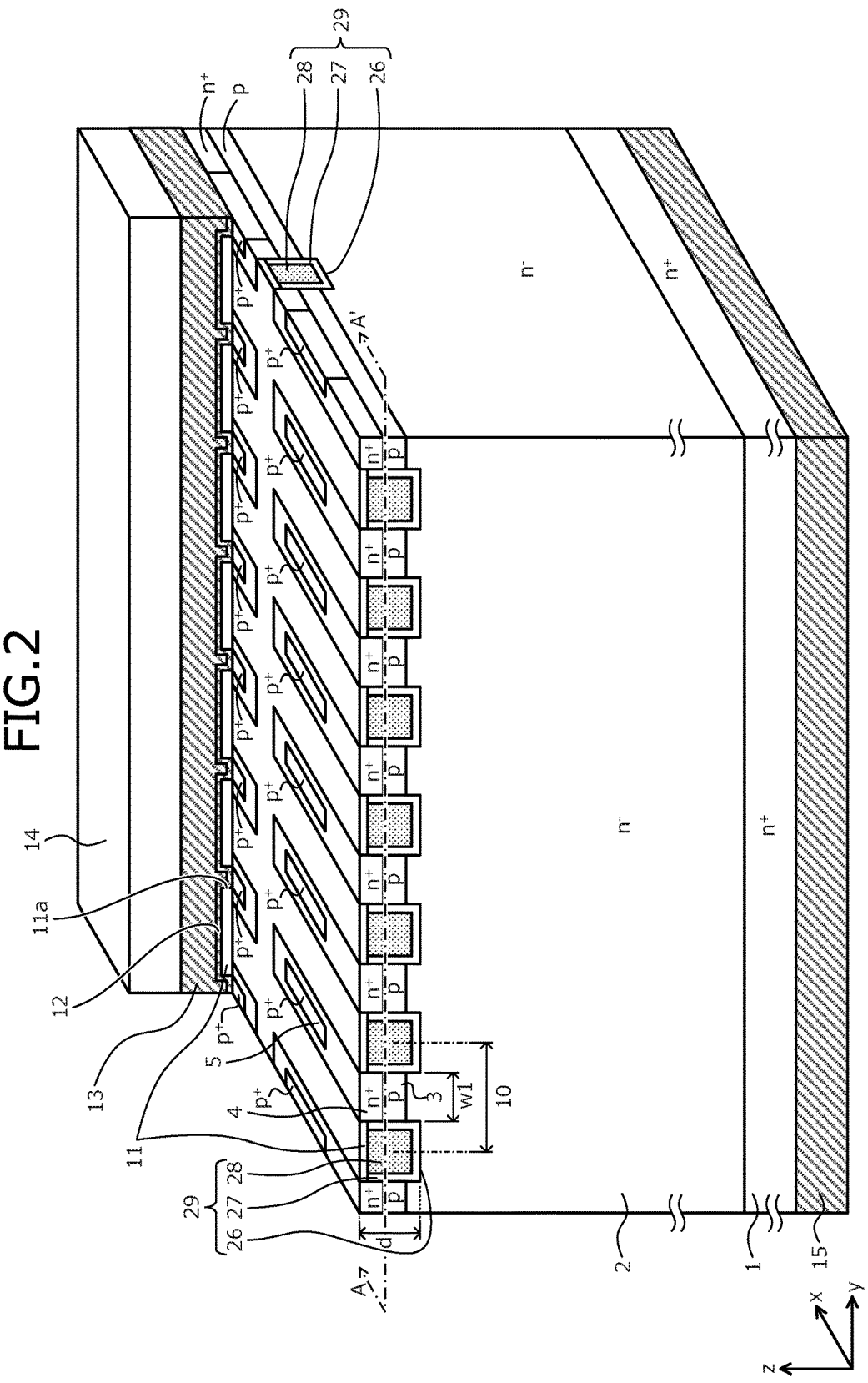
FIG. 2 is a perspective view of a structure of the semiconductor device according to a second embodiment.
Figure 3:
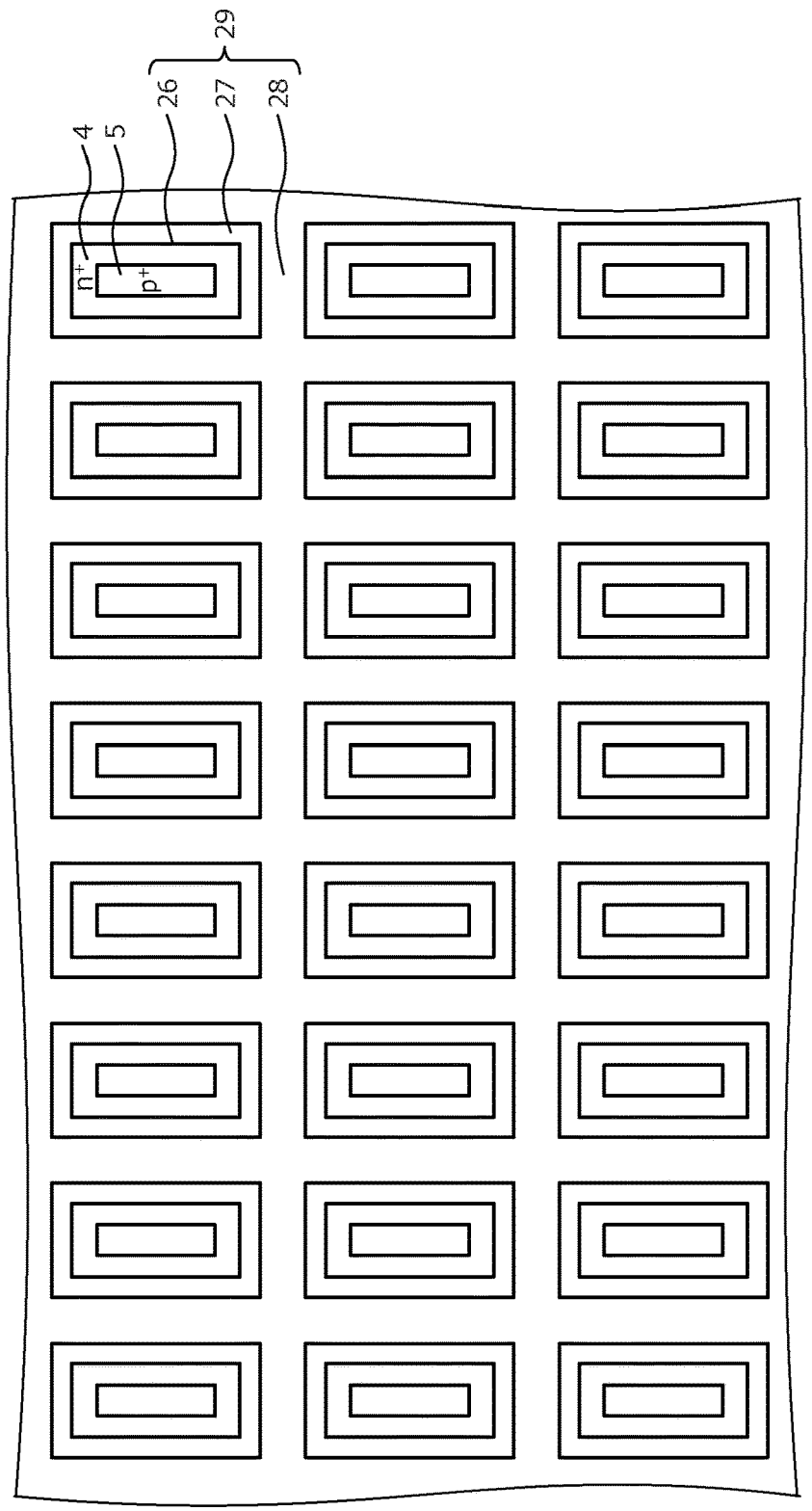
FIG. 3 is a plan view of a planar layout along a cutting line A-A' in FIG. 2.

Next, a structure of the semiconductor device according to a second embodiment will be described. FIG. 2 is a perspective view of a structure of the semiconductor device according to the second embodiment. FIG. 3 is a plan view of a planar layout along a cutting line A-A' in FIG. 2. FIG. 3 depicts the planar layout at cutting line A-A' transecting a gate electrode 28 in a direction parallel to the base front surface. The semiconductor device according to the second embodiment differs from the semiconductor device according to the first embodiment in that MOS gates 29 are arranged in a planar layout of a lattice shape. In other words, trenches 26 are arranged in a planar layout of a lattice shape extending in a striped shaped along the first direction x and extending in a striped shape along the second direction y. In the trench 26, the gate electrode 28 is provided via a gate insulating film 27.

The p-type base layers 3 have a planar layout of a matrix shape in which the p-type base layers 3 are arranged so as to be in contact with the gate insulating film 27 between the trenches 26, and are arranged to be adjacent to each other across the MOS gates 29 in the first direction x and adjacent to each other across the MOS gates 29 in the second direction y. The n$^+$-type source layer 4 is arranged on the p-type base layer 3. In other words, the n$^+$-type source layers 4, similar to the p-type base layers 3, are arranged so as to be in contact with the gate insulating film 27 between the trenches 26. The n$^+$-type source layers 4 have a planar layout of a matrix shape in which the n$^+$-type source layers 4 are adjacent to each other across the MOS gates 29 in the first direction x and are adjacent to each other across the MOS gates 29 in the second direction y. The p$^+$-type contact region 5 is arranged individually in each of the n$^+$-type source layers 4 separated by the trenches 26.

The method of manufacturing according to the second embodiment may be performed by performing in the method of manufacturing according to the first embodiment, etching for forming the trenches 26 to have a planar layout of a lattice shape. In other words, an etching mask for forming the trenches 26 is patterned in a planar layout of a lattice shape and the etching mask is used as a mask to form the trenches 26. Processes other than the process of forming the trenches 26 in the method of manufacturing according to the second embodiment are similar to those of the first embodiment.

As described, according to the second embodiment, effects identical to those of the first embodiment may be obtained. Further, according to the second embodiment, by arranging the gate electrodes in a planar layout of a lattice shape, wiring resistance differences of the gate electrodes may be equalized in the chip. As a result, at the poly-silicon layer in which the gate resistance becomes large, even when the gate electrode is formed, wiring delay differences consequent to gate delay at a portion of the gate electrode separate from the gate electrode pad may be reduced. As a result, wiring delay times may be substantially stabilized whereby even in cases of transient operation states, stable element characteristics may be maintained.

Figure 4:
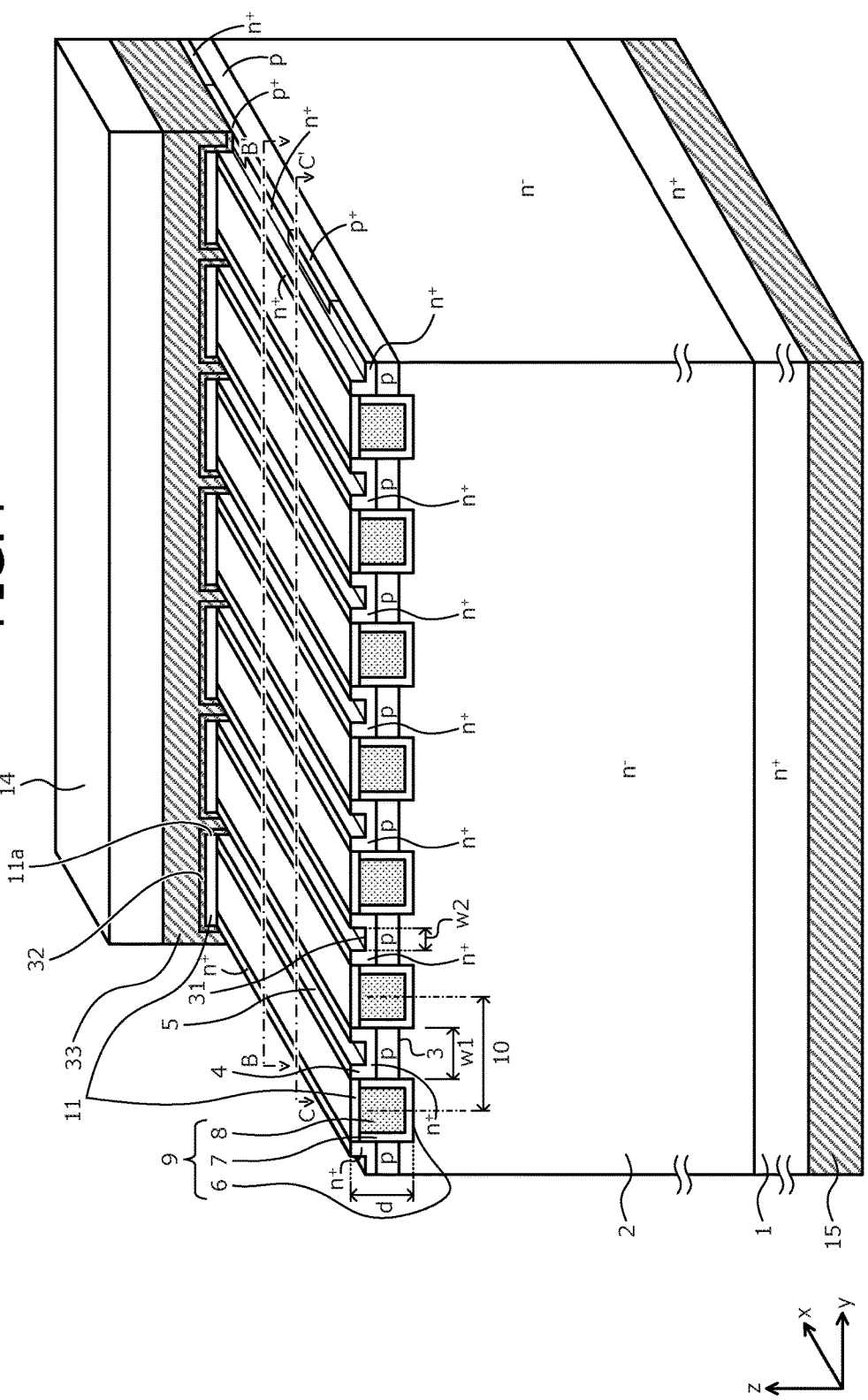
FIG. 4 is a perspective view of a structure of the semiconductor device according to a third embodiment.
Figure 5:
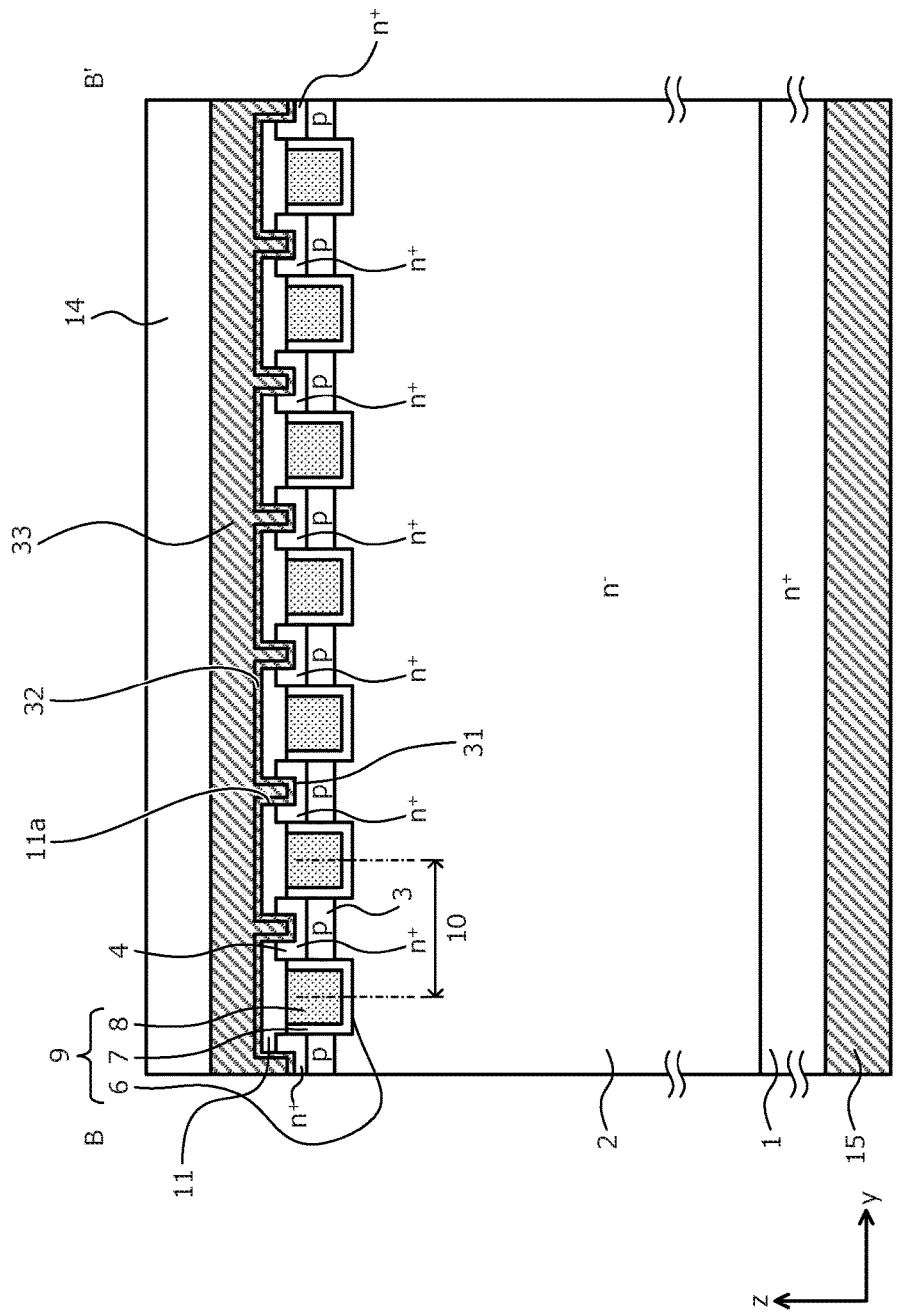
FIG. 5 is a plan view of a cross-section along a cutting line B-B' in FIG. 4.
Figure 6:
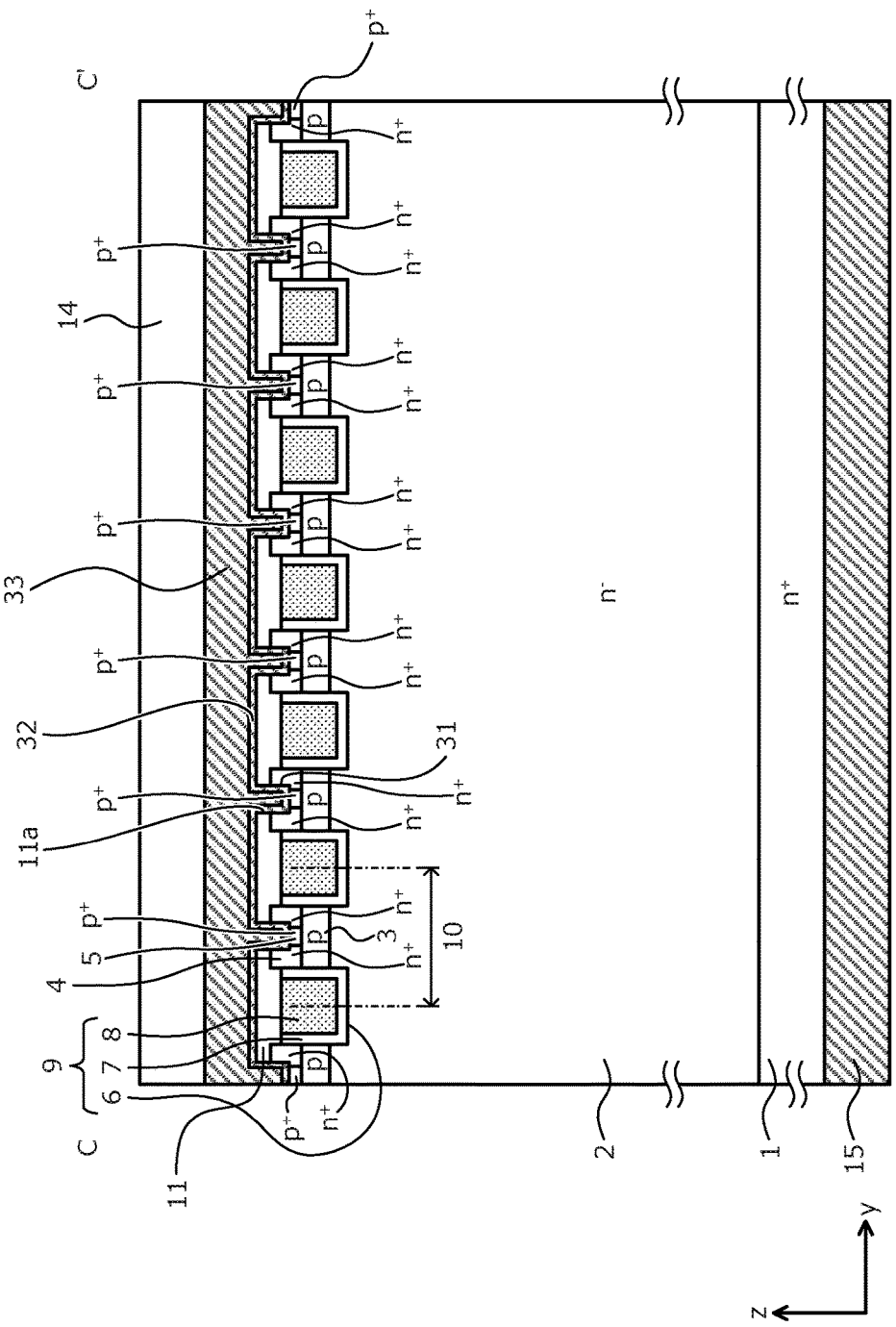
FIG. 6 is a plan view of a cross-section along a cutting line C-C' in FIG. 4.

Next, a structure of the semiconductor device according to a third embodiment will be described. FIG. 4 is a perspective view of the structure of the semiconductor device according to the third embodiment. In FIG. 4, to clearly depict planar layouts and cross-sectional views of the n$^+$-type source layer 4, the p$^+$-type contact region 5, the MOS gate 9, and a groove 31, a portion of a barrier metal 32 and a portion of a front electrode 33 in the front of the drawing are not depicted. FIG. 5 is a plan view of a cross-section along a cutting line B-B' in FIG. 4. FIG. 6 is a plan view of a cross-section along a cutting line C-C' in FIG. 4. The semiconductor device according to the third embodiment differs from the semiconductor device according to the first embodiment in that the groove 31 is provided at a portion of the silicon carbide semiconductor base exposed in the contact hole 11a whereby the area of ohmic contact of a source electrode (the barrier metal 32 and the front electrode 33) and the silicon carbide semiconductor base is increased.

In particular, as depicted in FIGS. 4, 5, and 6, the groove 31 is provided at the portion (i.e., the n$^+$-type source layer 4 and the p$^+$-type contact region 5) of the silicon carbide semiconductor base exposed in the contact hole 11a. The groove 31, for example, is arranged in a planar layout extending linearly along the first direction x. The groove 31 is provided to a depth not reaching the n$^-$-type drift layer 2 and, for example, may be shallower or deeper than a depth of the n$^+$-type source layer 4. A width w2 of the groove 31 along the second direction y is narrower than the width w1 between adjacent trenches 6 (w2<w1) and, for example, is about the same as a width of the contact hole 11a. In the groove 31, the front electrode 33 is embedded via the barrier metal 32. At an inner wall of the groove 31, the barrier metal 32 and the silicon carbide semiconductor base are in contact with each other, forming an ohmic contact.

The method of manufacturing according to the third embodiment may be performed by performing in the method of manufacturing according to the first embodiment, etching using the interlayer insulating film 11 as a mask to form the groove 31 in a portion of the silicon carbide semiconductor base exposed in the contact hole 11a, the etching being performed after the reflow of the interlayer insulating film 11 and before the formation of the barrier metal 32. Along the surface of the interlayer insulating film 11, the sidewall of the contact hole 11a, and an inner wall of the groove 31, the barrier metal 32 is formed to be in contact with the n$^+$-type source layer 4 and the p$^+$-type contact region 5. Thereafter, the front electrode 33 may be formed so as to be embedded in the contact hole 11a and the groove 31. In other words, other than adding a process of forming the groove 31, the method of manufacturing according to the third embodiment is similar to the method of manufacturing according to the first embodiment.

As described above, according to the third embodiment, effects identical to those of the first embodiment may be obtained. Further, according to the third embodiment, the area of the ohmic contact of the source electrode and the silicon carbide semiconductor base is increased, enabling contact resistance to be reduced and enabling the ON resistance to be further reduced. Therefore, even when the cell pitch is decreased and the chip size is reduced, the contact area may be maintained similar to that when the groove is not provided in the portion of the silicon carbide semiconductor base exposed in the contact hole, enabling the contact resistance to be prevented from becoming high. Thus, even when the cell pitch is narrow, the ON resistance may be maintained.

Figure 7:
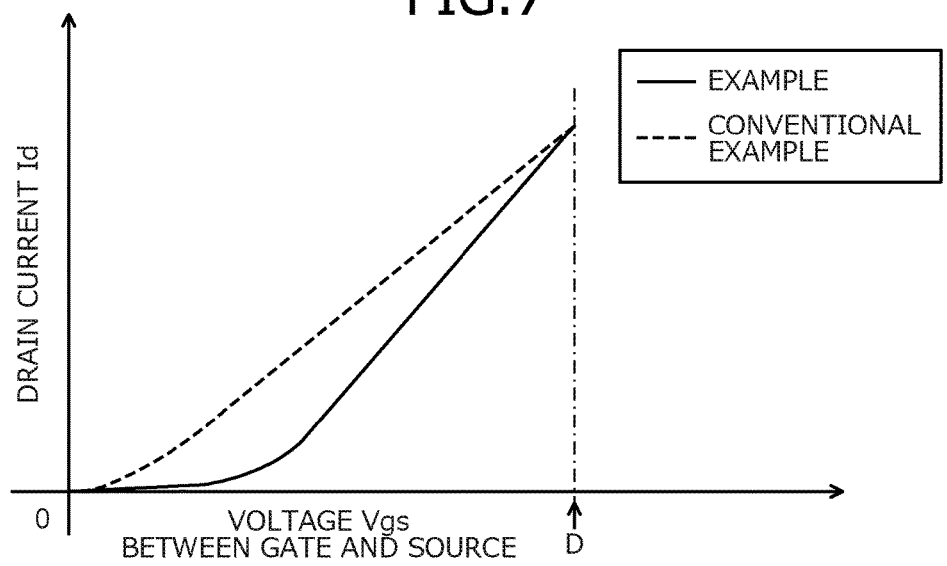
FIG. 7 is a characteristics diagram of current characteristics of a semiconductor device according to an example.
Figure 9:
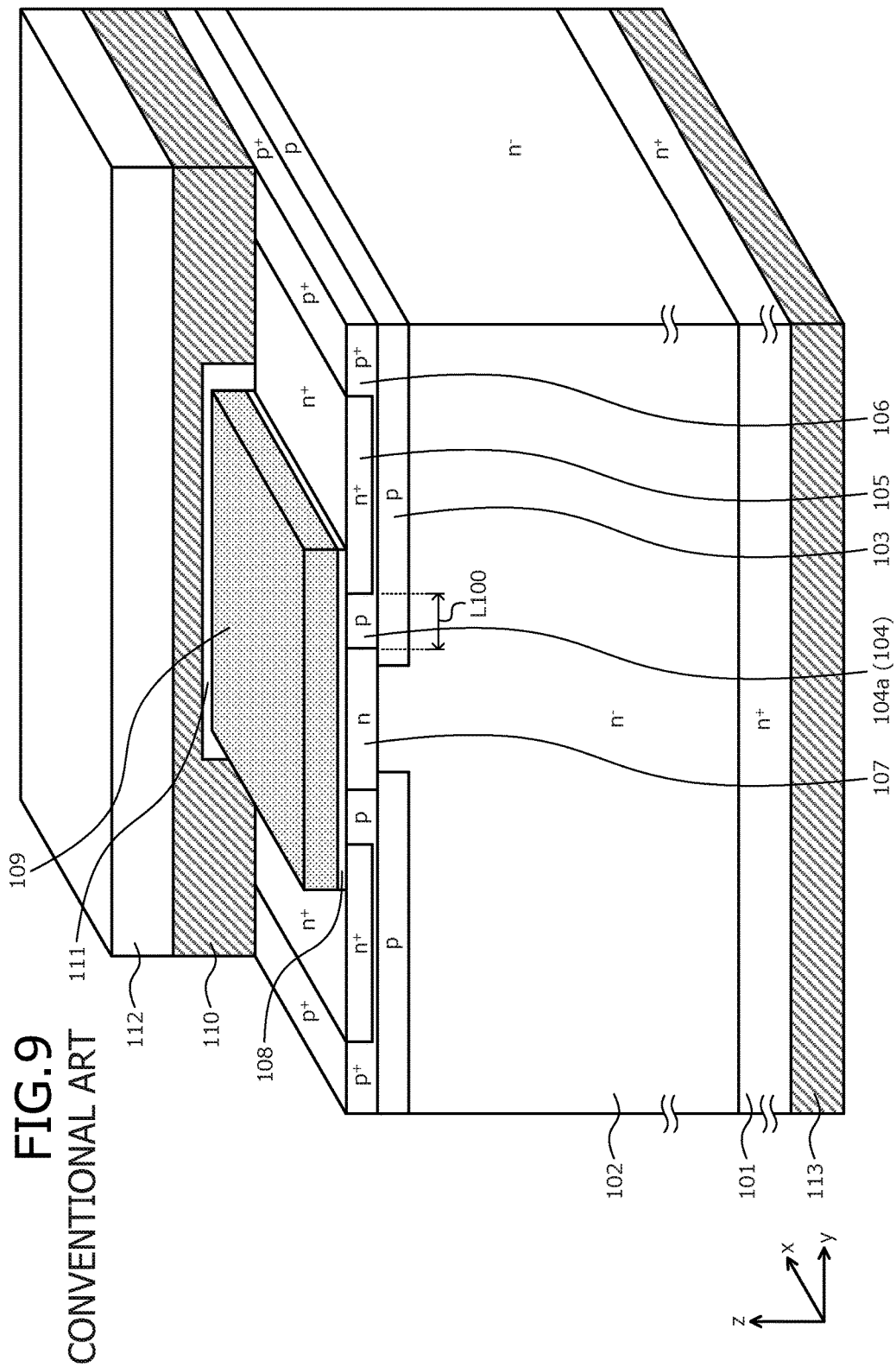
FIG. 9 is a perspective view of a structure of an active region of a conventional semiconductor device.

Static characteristics of the semiconductor device according to the present invention were verified. FIG. 7 is a characteristics diagram of current characteristics of a semiconductor device according to an example. In FIG. 7, point D represents the threshold voltage. FIG. 7 depicts results of simulation of drain current (current between the drain and source) Id characteristics when a gate voltage (voltage between the gate and source) Vgs applied to the described semiconductor device according to the first embodiment (hereinafter, EXAMPLE, refer to FIG. 1) is increased. For comparison, FIG. 7 further depicts the results of similarly simulating drain current Id characteristics of a conventional n-channel type MOSFET of a planar gate structure (hereinafter, conventional example, refer to FIG. 9). A channel length (width between the n$^+$-type source region 105 and the n-type JFET region 107) L100 of the conventional example was set to be equal to a channel length (thickness of the p-type base layer 3) L1 of the EXAMPLE.

From the results depicted in FIG. 7, it was confirmed that in the conventional example, the drain current Id increased in proportion to the increase of the gate voltage Vgs. In a MOS gate of a planar gate structure such as the conventional example, to lower the ON resistance, the channel length L100 has to be shortened. By shortening the channel length L100, the amount of charge of the surface inversion layer of the second p-type base layer 104a decreases, recombination of electrons and holes becomes less likely to occur, and the drain current Id flows easily in a region operating at a low gate voltage Vgs. In contrast, in the EXAMPLE, it was confirmed that in a region (region of the linear region near the boundary with the shutout region) operating at a low gate voltage Vgs, the rate of increase of the drain current Id with respect to the gate voltage Vgs is smaller than that in the conventional example. In other words, it was found that compared to the conventional example, in the EXAMPLE, the flow of the drain current Id was impeded in the low gate-voltage operating area. The reason for this is as follows.

In the present invention, the depth d of the trench 6 is shallow, the channel length L1 is short, and the width w1 between adjacent trenches 6 is narrow whereby parasitic capacitance between the p-type base layer 3 and the n$^-$-type drift layer 2 decreases. By applying the gate voltage Vgs to the p-type base layer 3 (which has a small parasitic capacitance) from both sides along the second direction y, the electrons and holes recombine, easily returning to an equilibrium state since the charge amount of the n-type inversion layer of the p-type base layer 3 is large. As a result, the p-type base layer 3 may be caused to be completely depleted. Therefore, in the region operating at a low gate voltage Vgs, adverse effects of a voltage Vds between the drain and source are minimal, enabling suppression of the drain current. Therefore, the drain current may be completely controlled by the gate voltage Vgs alone.

Figure 8:
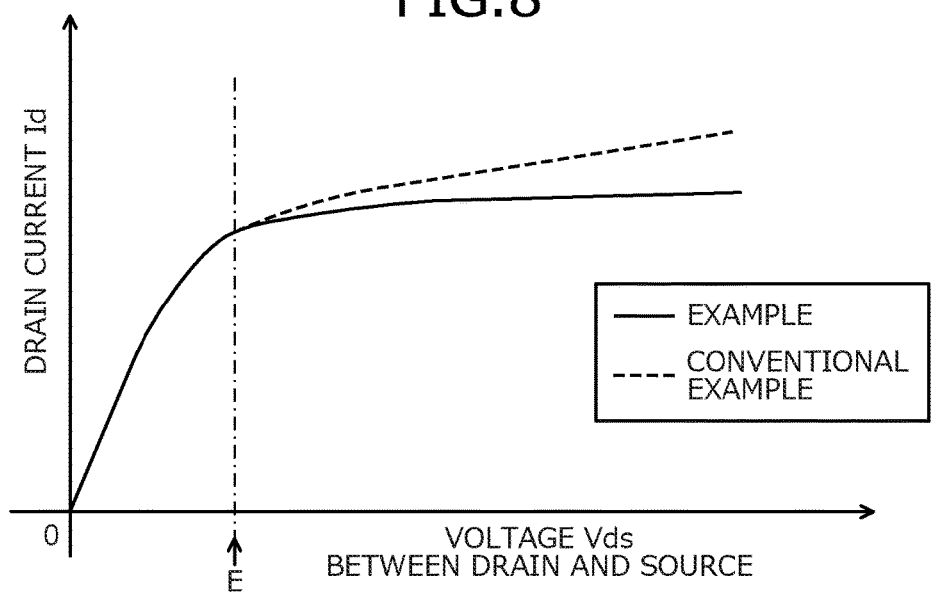
FIG. 8 is a characteristics diagram of current-voltage characteristics of the semiconductor device according to the example.

Further, current-voltage characteristics were simulated for both the EXAMPLE and the conventional example and the results are depicted in FIG. 8. FIG. 8 is a characteristics diagram of current-voltage characteristics of the semiconductor device according to the EXAMPLE. In FIG. 8, point E represents the pinch off voltage. From the results depicted in FIG. 8, it was confirmed that in the conventional example, after pinch off, even in a region (saturation region) operating at a high voltage Vds between the drain and source, the drain current Id flows easily and saturation is difficult. In contrast, it was confirmed that in the EXAMPLE, after pinch off, even in a region operating a high voltage Vds between the drain and source, adverse effects of the voltage Vds between the drain and source are minimal, increases of the drain current Id are suppressed, and saturation was possible.

In the described embodiments, various modifications are possible within a scope not departing from the spirit of the invention. For example, dimensions, impurity concentrations, etc. may be set according to necessary specifications. Further, in the embodiments, as an example, although a case has been described in which on an n$^-$-type semiconductor layer becoming a drift region, a p-type semiconductor layer and an n$^+$-type semiconductor layer are formed by epitaxial growth as a base region and a source region, respectively, the p-type base region and the n$^+$-type source region may be formed by ion implantation in the n$^-$-type semiconductor layer becoming the drift region. In this case, of the n$^-$-type semiconductor layer, a portion other than the p-type base region, the n$^+$-type source region, and the p$^+$-type contact region become the drift region. Further, a semiconductor substrate including silicon carbide (SiC substrate) may be used as a drift region; and the p-type base region, the n$^+$-type source region, and the n$^+$-type drain region may be formed in the SiC substrate by ion implantation. In this case, of the SiC substrate, a portion other than the p-type base region, the n$^+$-type source region, the p$^+$-type contact region, and the n$^+$-type drain region becomes the drift region.

Further, in the embodiments described, although a MOSFET is described as an example, even with application to a bipolar transistor or IGBT used as a switching device, similar effects are obtained. In the described embodiments, although a case is described in which a (0001) face of a silicon carbide substrate including silicon carbide is regarded as a main surface, without limitation hereto, various modifications such the plane orientation of the substrate main surface, the wide bandgap semiconductor material of the substrate, etc. are possible. For example, a (000-1) face may be set as a substrate main surface; a semiconductor substrate including a wide bandgap semiconductor material such as gallium nitride (GaN) may be used, etc. Further, in the embodiments, although a first conductivity type is set to be an n-type and a second conductivity type is set to be a p-type, the present invention is similarly implemented when the first conductivity type is set to be a p-type and the second conductivity type is set to be an n-type.

Nonetheless, with the conventional semiconductor device, as described above, in particular, although the channel resistance has to be reduced to reduce the ON resistance, when the channel resistance is reduced, in a low gate-voltage operating area (operating region of a linear region near a boundary with a shutout region), current (drain current) between the drain and source flows easily consequent to short channel effects, making elements difficult to turn OFF. In other words, the threshold voltage varies and becomes lower. In addition, after pinch off, in a region operating a high voltage between the drain and source (saturation region) as well, drain current flows easily, making saturation difficult. In this manner, controlling the drain current by the gate voltage is difficult, arising in a problem of decreased reliability.

According to the present invention, JFET resistance may be eliminated and channel resistance may be reduced. Further, according to the present invention, since short channel effects may be suppressed, at low gate-voltage operating areas, the flow of current between the first and second electrodes may be impeded. Further, after pinch off, in a region operating at high voltage between the first and second electrodes as well, the flow of current between the first and second electrodes becomes difficult. Therefore, current between the first and second electrodes may be completely controlled by only the gate voltage.

The semiconductor device according to the present invention achieves an effect in that the ON resistance may be reduced and decreases in reliability may be prevented.

As described, the semiconductor device according to the present invention is useful for a semiconductor device used as a switching device and is particularly suitable for a vertical MOSFET produced on a silicon carbide semiconductor base.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate of a first conductivity type and including a wide bandgap semiconductor material having a bandgap wider than that of silicon;
   a first semiconductor layer of the first conductivity type provided on a front surface of the semiconductor substrate, the first semiconductor layer including the wide bandgap semiconductor material and having an impurity concentration lower than that of the semiconductor substrate, the first semiconductor layer having a first side and a second side;
   a second semiconductor layer of a second conductivity type provided on the first side of the first semiconductor layer opposite to the second side facing the semiconductor substrate, the second semiconductor layer including the wide bandgap semiconductor material and having a first side and a second side;
   a third semiconductor layer of the first conductivity type provided on the first side of the second semiconductor layer opposite to the second side facing the semiconductor substrate, the third semiconductor layer including the wide bandgap semiconductor material and having a first side facing the second semiconductor layer, the second semiconductor layer substantially covering an entire area of the first side of the third semiconductor layer;
   a second-conductivity-type semiconductor region provided selectively in the third semiconductor layer, penetrating the third semiconductor layer in a depth direction and reaching the second semiconductor layer such that a bottom surface of the second-conductivity-type semiconductor region contacts a surface of the first side of the second semiconductor layer, the second-conductivity-type semiconductor region having an impurity concentration higher than that of the second semiconductor layer;
   a trench penetrating the third semiconductor layer and the second semiconductor layer and reaching the first semiconductor layer;
   a gate insulating film provided on walls of the trench;
   a gate electrode provided in the trench and sandwiched, in the trench, by the gate insulating film;
   a first electrode provided in contact with the third semiconductor layer and the second-conductivity-type semiconductor region; and
   a second electrode provided in contact with a rear surface of the semiconductor substrate, wherein
   a width between the trench and an adjacent trench is 1 µm or less, and a depth of the trench is 1 µm or less, and
   the semiconductor device has a breakdown voltage class of 1200V or higher.

2. The semiconductor device according to claim 1, wherein
   the trench is arranged in planar layout having a striped shape parallel to the front surface of the semiconductor substrate.

3. The semiconductor device according to claim 1, wherein
   the trench is arranged in a planar layout having a lattice shape parallel to the front surface of the semiconductor substrate.

4. The semiconductor device according to claim 1, comprising
   a groove provided at a predetermined depth from surfaces on respective first sides of the third semiconductor layer and the second-conductivity-type semiconductor region, the respective first sides being opposite respective second sides of the third semiconductor layer and the second-conductivity-type semiconductor region facing the semiconductor substrate,
   wherein the first electrode is provided to be in contact with the third semiconductor layer and the second-conductivity-type semiconductor region at an inner wall of the groove.

5. The semiconductor device according to claim 1, wherein
   silicon carbide is used as the wide bandgap semiconductor material.

6. The semiconductor device according to claim 1, wherein the semiconductor substrate is a nitrogen-doped silicon carbide semiconductor substrate.

7. The semiconductor device according to claim 1, wherein the trench includes a first trench and a second trench spaced apart from each other and separated from each other by the second semiconductor layer and the third semiconductor layer, and
   the third semiconductor layer extends contiguously between the first trench and the second trench.

8. The semiconductor device according to claim 1, wherein the trench includes a first trench and a second trench spaced apart from each other and separated from each other by the second semiconductor layer and the third semiconductor layer, and
   a portion of the first semiconductor layer extends contiguously between the first trench and the second trench.

* * * * *